(12) United States Patent
Roy et al.

(10) Patent No.: US 10,971,986 B2
(45) Date of Patent: Apr. 6, 2021

(54) BROADBAND VIBRATIONAL ENERGY HARVESTING DEVICE COMBINING MULTIPLE NONLINEARITY

(71) Applicant: UNIVERSITY COLLEGE CORK—NATIONAL UNIVERSITY OF IRELAND, CORK, Cork (IE)

(72) Inventors: Saibal Roy, Cork (IE); Pranay Podder, Cork (IE); Dhiman Mallick, Cork (IE); Andreas Amann, Cork (IE)

(73) Assignee: UNIVERSITY COLLEGE CORK—NATIONAL UNIVERSITY OF IRELAND, CORK, Cork (IE)

(*) Notice: Subject to any disclaimer, the term of this patent is extended or adjusted under 35 U.S.C. 154(b) by 655 days.

(21) Appl. No.: 15/737,275

(22) PCT Filed: Jun. 16, 2016

(86) PCT No.: PCT/EP2016/063940
§ 371 (c)(1),
(2) Date: Dec. 15, 2017

(87) PCT Pub. No.: WO2016/202948
PCT Pub. Date: Dec. 22, 2016

(65) Prior Publication Data
US 2018/0191231 A1     Jul. 5, 2018

(30) Foreign Application Priority Data
Jun. 19, 2015  (GB) ...................................... 1510794

(51) Int. Cl.
*H01L 41/113*  (2006.01)
*H02N 2/18*  (2006.01)
(Continued)

(52) U.S. Cl.
CPC ............. *H02K 35/02* (2013.01); *G01H 11/02* (2013.01); *G01H 11/08* (2013.01); *G01R 17/00* (2013.01);
(Continued)

(58) Field of Classification Search
CPC .. H02K 35/02; H01L 41/1132; H01L 41/1136
(Continued)

(56) References Cited

U.S. PATENT DOCUMENTS

2009/0295163 A1* 12/2009 Frayne ................. H02K 7/1892
                                                                290/54
2010/0176664 A1*  7/2010 Roberts ................. H02K 35/02
                                                                310/25

FOREIGN PATENT DOCUMENTS

WO     2009/039293 A1    3/2009
WO     2016/202948 A1   12/2016

OTHER PUBLICATIONS

Ando et al., "Nonlinear mechanism in MEMES devices for energy harvesting applications," Journal of Micromechanics and Microengineering, vol. 20, No. 12, 12 pages, Nov. 18, 2010.
(Continued)

*Primary Examiner* — Derek J Rosenau
(74) *Attorney, Agent, or Firm* — Hamilton, Brook, Smith & Reynolds, P.C.

(57) ABSTRACT

A vibrational energy harvesting device is disclosed, which comprises first and second assemblies mounted on a base at a distance one from the other. The first assembly comprises vibrational means adapted to stretch under a straining force, whereby the device exhibits monostable quartic nonlinearity. The first and second assemblies comprise respective magnetised means in opposite polarity to one another, so that the second assembly exerts a repulsive magnetic force upon the vibrational means, whereby the device exhibits bistabil-
(Continued)

ity. Both the monostable quartic and bistable nonlinearities can be independently controlled. A method of harvesting energy with the vibrational energy harvesting device is also disclosed.

20 Claims, 8 Drawing Sheets

(51) Int. Cl.
    *H02K 35/02*     (2006.01)
    *G01H 11/02*     (2006.01)
    *G01H 11/08*     (2006.01)
    *G01R 17/00*     (2006.01)

(52) U.S. Cl.
    CPC ...... *H01L 41/1132* (2013.01); *H01L 41/1136* (2013.01); *H02N 2/186* (2013.01)

(58) Field of Classification Search
    USPC .......................................................... 310/339
    See application file for complete search history.

(56) References Cited

OTHER PUBLICATIONS

Cottone et al., "Nonlinear Energy Harvesting," Physical Review Letters, The American Physical Society, vol. 102, 4 pages, Feb. 27, 2009.

Erturk et al., "A piezomagnetoelastic structure for broadband vibration energy harvesting," Applied Physics Letters, American Institute of Physics, vol. 94, 4 pages, 2009.

Ferrair et al.,"Improved Energy Harvesting from Wideband Vibrations by Nonlinear Piezoelectric Converters," Procedia Chemistry, Science Direct, vol. 1, pp. 1203-1206, 2009.

Gao et al., "Performance of bistable piezoelectric cantilever vibration energy harvesters with an elastic support external magnet," Smart Materials and Structures, vol. 23, 14 pages, 2014.

Harne et al., "A review of the recent research on vibration energy harvesting via bistable systems," Smart Materials and Structures, vol. 22, 12 pages, 2013.

Mallick et al., "A nonlinear stretching based electromagnetic energy harvester on FR4 for wideband operation," Smart Materials and Structures, vol. 24, 14 pages, 2015.

Mallick et al., "Analysis of Nonlinear Spring Arm for Improved Performance of Vibrational Energy Harvesting Devices," Journal of Physics: Conference Series, vol. 476, 6 pages, 2013.

Mallick et al., "Wideband electromagnetic energy harvesting from ambient vibrations," AIP Conference Proceedings, vol. 1665, 4 pages, 2015.

Mann et al., "Energy harvesting from the nonlinear oscillations of magnetic levitation," Journal of Sound and Vibration, vol. 319, pp. 515-530, 2009.

Marinkovic et al., "Smart Sand—a wide bandwidth vibration energy harvesting platform," Applied Physics Letters, American Institute of Physics, vol. 94, 4 pages, 2009.

Podder et al., "Bandwidth widening in nonlinear electromagnetic vibrational generator by combined effect of bistability and stretching," Journal of Physics: Conference Series, vol. 557, 6 pages, 2014.

Xu et al., "Electromechanical Modeling and Experimental Verification of Nonlinear Hybrid Vibration Energy Harvester," IEEE, 4 pages, 2014.

Zhou et al., "Modeling and experimental verification of doubly nonlinear magnet-coupled piezoelectric energy harvesting from ambient vibration," Smart Materials and Structures, vol. 24, 14 pages, 2015.

International Search Report and Written Opinion dated Sep. 28, 2016 for International Application No. PCT/EP2016/063940 entitled "Broadband Vibrational Energy Harvesting Device Combining Multiple Nonlinearity."

\* cited by examiner

BROADBAND VIBRATIONAL ENERGY HARVESTING DEVICE COMBINING MULTIPLE NONLINEARITY

This application is the U.S. National Stage of International Application No. PCT/EP2016/063940, filed Jun. 16, 2016, which designates the U.S., published in English, and claims priority under 35 U.S.C. §§ 119 or 365(c) to Great Britain Application No. 1510794.9, filed Jun. 19, 2015. The entire teachings of the above applications are incorporated herein by reference.

FIELD

The present invention relates to a method of harvesting vibration energy and to an energy harvesting device. More particularly, the present invention relates to a wideband vibrational energy harvesting device.

BACKGROUND

With advances in integrated circuit technology, the size and power consumption of modern electrical applications have reduced dramatically. Wireless sensor networks (WSNs), which find applications in a plethora of human interests and activities, e.g. environmental and structural health monitoring, surveillance, medical sensors for remote diagnosis, wearable electronic devices etc. leading to 'Internet-of-Things' (IoT), can be powered at few to hundreds of microwatts.

Though battery is the most conventional choice for powering such WSNs, they suffer from a number of drawbacks such as limited energy density over the years, expensive replacement cost and chemical hazards to name a few. Thus, vibrational energy harvesting (VEH) has emerged in the last decade as the potential alternative of battery, to power such WSNs mainly due to their abundance in nature.

Basic VEH devices consist of a spring, a seismic mass and a damping element. The response of most of the earlier reported VEH systems are linear/resonant in nature i.e. they produce the maximum output at the resonance frequency, but the response drops drastically when frequency shifts slightly. In a practical setting, such change of frequency is often observed. Thus to efficiently convert the vibrational energy that is available over a range of frequency, wideband mechanisms are essential.

Research is being conducted on wideband energy harvesting using nonlinear oscillators. Nonlinear oscillators have amplitude modulated stiffness, which provides broadband response under external excitation.

Intentional introduction of nonlinearity into harvesting device dynamics were first reported by Mann et al in "Energy harvesting from the nonlinear oscillations of magnetic levitation" (Journal of Sound and Vibration 319 (2009) 515-530) and by Cottone et al in "Nonlinear energy harvesting" (Physical Review Letter 102, 080601 (2009)).

Wideband nonlinear oscillators with amplitude modulated stiffness constants are now used to overcome the limitation of the resonant systems. The two main categories of nonlinear systems, namely monostable and bistable systems, are used for that purpose. The classification is based on the potential function of the nonlinear oscillator which is given as $$U(x) = -\frac{1}{2}\alpha(1-r)x^2 + \frac{1}{4}\beta x^4$$

wherein x is the displacement, $\alpha$, $\beta$ are constants and r is a constant that determines nature of nonlinearity.

Nonlinear monostable devices based on cantilever stretching (hardening nonlinearity) effects were studied in "Smart Sand—a wide bandwidth vibration energy harvesting platform" (Appl. Phys. Lett., 94:103505 (2009)) and this configuration also demonstrated bandwidth widening effects. A similar bandwidth widening effect was observed for different structural topologies in "A nonlinear stretching based electromagnetic energy harvester on FR4 for wideband operation" (Smart Mater. Struct. 24:-015013, 2015).

Erturk et al developed and studied a piezomagnetoelastic device consisting of a ferromagnetic cantilever and piezoceramic laminates for power generation in "A piezo-magneto-elastic structure for broadband vibration energy harvesting" (Applied Physics Letters 94 (254102) (2009) 1-3). They studied forced responses at various frequencies and obtained large amplitude periodic responses across a wide range of excitation frequencies.

US 2012/0068577 A1 disclosed a micro-scale piezoelectric nonlinear energy harvesting device, in which a central mass is suspended by four tethers with piezoelectric materials. The vertical motion of the suspended mass would produce stress in the tethers, and thereby generate electricity in the piezoelectric material, wherein the beams supporting the mass produce stretching-based nonlinearity.

WO 2014/116794 A1 described a meandered piezoelectric cantilever based energy harvester for very low frequency (~1 Hz) operation, in which a magnetic component at the free end of the beam allows nonlinear vibration, and wide operational frequency range. This device however employed piezoelectric transduction, which requires load matching circuitry.

Monostable systems, though nonlinear, have a single potential well like linear systems. The oscillator movement is confined within a single well. As a result it needs high forces to produce a large amplitude motion. On the contrary, bistable systems have twin potential wells and thus can move from one well to the other even under smaller forces, and still can produce a large amplitude motion. US 2010/0207491 A1 disclosed a bistable piezoelectric energy harvester with two potential wells on either sides of an initial equilibrium, wherein the proposed configuration consisted of a cantilever fixed at one end, and free to oscillate, and that device showed wider frequency response.

Ferrari et al investigated a system similar to that described in "Improved Energy Harvesting from Wideband Vibrations by Nonlinear Piezoelectric Converters, Sensors and Actuators" (A: Physical, 162 (2010), 425-431), wherein bistability was introduced into the system by oppositely positioned permanent magnets.

Monostable and bistable system therefore have an inherent capability to improve the off-resonance performance compared to a resonant system, demonstrably wider frequency bandwidth under harmonic and random excitations compared to the corresponding linear vibrational energy harvesters (VEHs).

Whilst the bistable systems exhibit wideband response under random vibrations, it was observed that they could generate appreciable energy at rather high accelerations, when the oscillator could overcome the potential barrier and jump from one potential well to the other.

By contrast, the high energy attractor of motion of the monostable systems is largely dependent on the initial conditions and can only be achieved through proper frequency sweep. Furthermore, usually the nonlinear components of the spring force come into effect at large deflection, which can be triggered at relatively large vibrational acceleration.

Thus, while both bistable and monostable quartic nonlinearity has been demonstrated to achieve wider frequency responses, the effects of combining both techniques in a single device topology on the system dynamics and performance remain unexplored so far.

SUMMARY

The present invention combines the effects of bistability and stretching based nonlinearity into a single device configuration in order to augment the overall performance of nonlinear VEH systems. A novel vibrational energy harvesting device combines these two types of nonlinearity and results in improved bandwidth. Specifically, bistability is introduced by repulsive magnetic force between two oppositely polarized magnetised bodies, and monostable quartic nonlinearity is incorporated by a clamped-guided member that undergoes stretching when large deflection occurs. Static numerical analysis exhibits significant transformation in the potential energy and restoring force profiles when both bistable and monostable quartic nonlinearity are activated simultaneously, and subsequent experimental results show significant improvement in bandwidth, particularly in the low frequency domain of the vibrational excitation.

Thus, according to an aspect of the present invention, a broadband vibrational energy harvesting device adapted to simultaneously combine bistable and monstable quartic potential energy profiles is provided, which comprises first and second assemblies mounted at a distance one from the other, wherein the first assembly comprises vibrational means adapted to stretch under a straining force, whereby the device exhibits monostable quartic nonlinearity, and wherein the first and second assemblies comprise respective magnetised means in opposite polarity to one another, so that the second assembly exerts a repulsive magnetic force upon the vibrational means, whereby the device exhibits bistability.

The proposed device incorporates monostability and bistability into a single electromagnetic transduction system to generate power over a very wideband region, much wider than a sole monostable or bistable system. Combining both in a single system narrows down the intermediate potential barrier and eases the large amplitude inter well motion and produces high power and wider frequency response.

In an embodiment of the device, the bistable and monstable quartic potential energy profiles are adapted to be independently modified.

This enables the dynamical nature of the energy device to be modified as required (e.g. bistable, monostable quartic, bistable quartic etc.).

In an embodiment of the device, the vibrational means comprises an elongate member with at least one fixedly supported extremity and at least one unsupported extremity longitudinally opposed to the first, the magnetised means of the first assembly comprises a first magnetised assembly mounted to the elongate member proximate the unsupported extremity of the elongate member, having a polarity along a longitudinal direction of the elongate member; and the magnetised means of the second assembly comprises a second magnetised assembly located adjacent the unsupported extremity of the first assembly, at the distance between the first and second assemblies, and in opposite polarity to the first magnetised assembly such that the repulsive magnetic forces between the first assembly and the second assembly cause multiple equilibrium states.

In an embodiment of the device, the elongate member comprises at least one clamped guided cantilever or a diaphragm. The elongate member may for instance be a printed circuit board (PCB), optionally to the FR4 standard or silicon or other metal or polymer material.

In an embodiment of the device, the clamping point of the clamped-guided cantilever or diaphragm is adjustable to vary the cubic-force-deflection relationship.

In an embodiment of the device, the device may further comprise at least one piezoelectric element attached to the clamped-guided cantilever or diaphragm for transducing deflection into electricity.

Thus, electricity can be harvested from the magnetised means and the piezoelectric element simultaneously, leading to a hybrid transduction system.

In an embodiment of the device, the repulsive magnetic force may be adjusted as a function of the distance between the first and the second magnetised assemblies.

In an embodiment of the device, the first magnetised assembly may comprise a plurality of magnets, generating a high flux gradient, the device further comprising a coil arranged between the magnets. The magnets in this and any other embodiment may be permanent rare earth magnets, for instance made of neodymium-iron-boron material or may be non rare earth magnets. Other types of permanent magnets (samarium-cobalt, Alnico etc.) may also be incorporated for the above energy harvesting assembly.

In an embodiment of the device, the second assembly of the device may comprise at least one support member and the second magnetised assembly may comprise at least one magnet secured to the at least one support member.

In an embodiment of the device, the first magnetised assembly may further comprise a plurality of high permeability soft magnetic steel blocks or plates arranged adjacent the plurality of magnets, so as to intensify the magnetic flux thereof. Other high permeability soft magnetic materials such as mu-metal, permalloy, Metglas® etc. may also be incorporated for this purpose.

In an embodiment of the device, the device may further comprise at least one magnet fixed to the elongate member substantially at the unsupported extremity, substantially intermediate the first and second magnetised assemblies, having a polarity along the longitudinal direction of the elongate member and opposite to the polarity of the second magnetised assembly.

In an embodiment of the device, a plurality of elongate leg members mounts the first and second assemblies on the base, and wherein at least one leg member fixedly attaches the first assembly to the base at the fixed extremity thereof.

In an embodiment of the device, the elongate member is slotted so as to define a pair of longitudinal beams and wherein the first magnetised assembly is mounted within the slot between the beams. In a variant of this embodiment, the coil introduced above may be located proximate the mid-point of the slot and between the magnets. In a further variant, a leg member introduced above may attach the first assembly fixedly to a base proximate the mid-point of each longitudinal beam.

A further embodiment of the device may include means to perturb and/or drive the system into a high energy branch corresponding to a high amplitude motion, in case the system vibrates into a low-energy branch representative of a low output voltage. Power output from a linear device, for instance the vibrational means of the first assembly, may be stored in an energy storage module and subsequently used to actuate, or at least momentarily perturb, the nonlinear system whenever it captures the low energy branch. A voltage comparator circuit may be used to determine whether the oscillator is in its low or high energy branch. This embodiment advantageously implements amplitude tuning of the device to increase the output power over a wider bandwidth of operation.

According to another aspect of the present invention, there is also provided a method of harvesting energy with a broadband vibrational energy harvesting device adapted to simultaneously combine bistable and monostable quartic potential energy profiles, the method comprising the steps of providing a first assembly of the device, comprising first magnetised means having a polarity and vibrational means adapted to stretch under a straining force, whereby the device exhibits monostable quartic nonlinearity; providing a second assembly of the device, comprising second magnetised means having a polarity opposite to the polarity of the first magnetised means; mounting the first and second assembly at a distance one from the other; and subjecting the device to a force apt to induce vibration in the first assembly.

An embodiment of the method may comprise the further step of adjusting the distance between the first and second assemblies.

In an embodiment wherein the first assembly comprises an elongate member, the method may comprise the further step of securing a first extremity of the member to a base, thereby leaving an extremity longitudinally opposed to the first extremity unsupported.

In an embodiment of the method, the elongate member comprises at least one clamped guided cantilever or a diaphragm.

An embodiment of the method may comprise adjusting the clamping point of the clamped-guided cantilever or diaphragm to vary the cubic-force-deflection relationship.

In an embodiment of the method, the vibrational energy harvesting device further comprises at least one piezoelectric element attached to the clamped-guided cantilever or diaphragm for transducing deflection into electricity.

An embodiment of the method may comprise the further step of detecting a low power output of the device operably and driving the first assembly into a high amplitude motion according to the detecting. Preferably, the step of driving comprises the further step of storing energy of the vibrational means in an energy storage module.

In an embodiment there is provided a vibrational energy harvesting device, wherein non-rare earth permanent magnets (such as CoPt or FePt) may be fabricated using sputtering, electrodeposition or other physical or chemical deposition techniques to facilitate complete integration of the device on silicon or silicon-on-insulator or any other substrate. Moreover, giant energy product exchange spring or exchange coupled permanent magnets may also be incorporated in the device.

In an embodiment the method can be further extended to monostable combined with other multistable (such as tristable, pentastable) nonlinear structures to widen the bandwidth of a vibrational energy harvesting device.

In an embodiment the bistable-monostable combined device topology can be further modified and implemented in other transduction mechanisms (piezoelectric, electrostatic, triboelectric) or hybrid transduction mechanisms comprising more than one of the above transduction mechanisms simultaneously.

In an embodiment the vibrational energy harvesting device positioned on FR4/PCB material has been tested for reliability by operating over 10 million to 100 million cycles.

According to another aspect of the present invention, a vibrational energy harvesting device is provided, which comprises first and second assemblies mounted at a distance one from the other, wherein the first assembly comprises vibrational means adapted to stretch under a straining force, whereby the device exhibits monostable quartic nonlinearity, and wherein the first and second assemblies comprise respective magnetised means in opposite polarity to one another, so that the second assembly exerts a repulsive magnetic force upon the vibrational means, whereby the device exhibits bistability.

According to another aspect of the present invention, there is also provided a method of harvesting energy with a vibrational energy harvesting device, comprising the steps of providing a first assembly of the device, comprising first magnetised means having a polarity and vibrational means adapted to stretch under a straining force, whereby the device exhibits monostable quartic nonlinearity; providing a second assembly of the device, comprising second magnetised means having a polarity opposite to the polarity of the first magnetised means; mounting the first and second assembly at a distance one from the other; and subjecting the device to a force apt to induce vibration in the first assembly.

Other aspects of the invention are as set out in the appended claims.

BRIEF DESCRIPTION OF THE DRAWINGS

The invention will be more clearly understood from the following description of an embodiment thereof, given by way of example only, with reference to the accompanying drawings, in which:—

DETAILED DESCRIPTION OF THE DRAWINGS

There will now be described by way of example a specific mode contemplated by the inventors. In the following description numerous specific details are set forth in order to provide a thorough understanding. It will be apparent however, to one skilled in the art, that the present invention may be practiced without limitation to these specific details. In other instances, well known methods and structures have not been described in detail so as not to unnecessarily obscure the description.

The words "comprises/comprising" and the words "having/including" when used herein with reference to the present invention are used to specify the presence of stated features, integers, steps or components but does not preclude the presence or addition of one or more other features, integers, steps, components or groups thereof.

The vibrational energy harvesting device described herein was analytically modelled, simulated, fabricated and characterized in nonlinear bistable configuration, both excluding and including the quartic monostable stretching effect. It was observed that, when stretching effects were included (thus combining quartic-monostability) in the bistable energy harvesting system, the harvested frequency bandwidth was enhanced significantly. Thus, the frequency response can be augmented by exploiting both the softening and hardening nonlinearity in the conceptualized device configuration.

Figure 1:
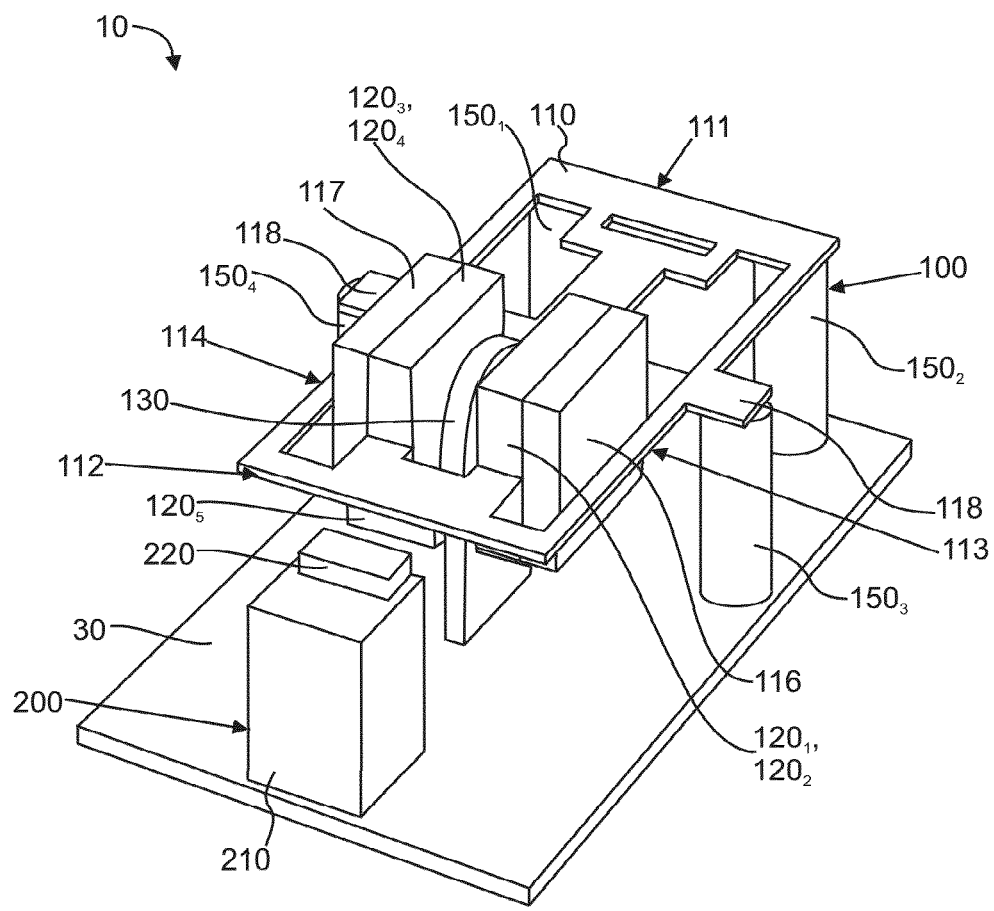
FIG. 1 shows a perspective view of a first embodiment of a vibrational energy harvesting device according to the invention.
Figure 2:
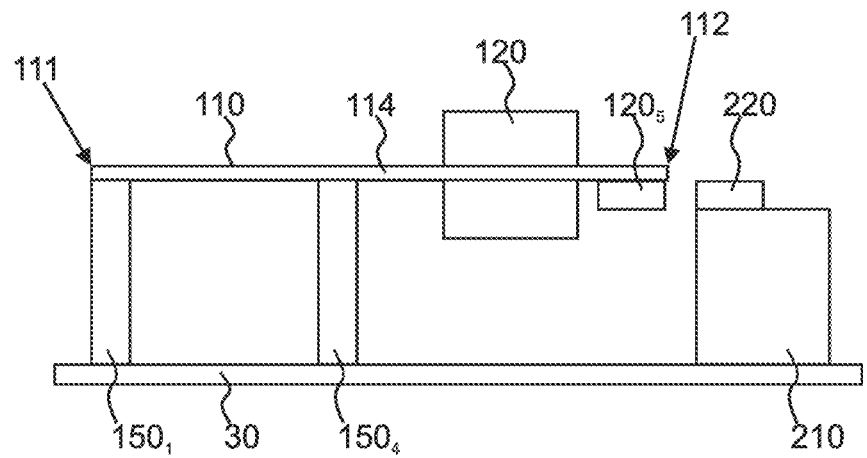
FIG. 2 illustrates the bending and longitudinal stretching deformation of the device of FIG. 1 during vibration relative to a resting position of same.
Figure 2:
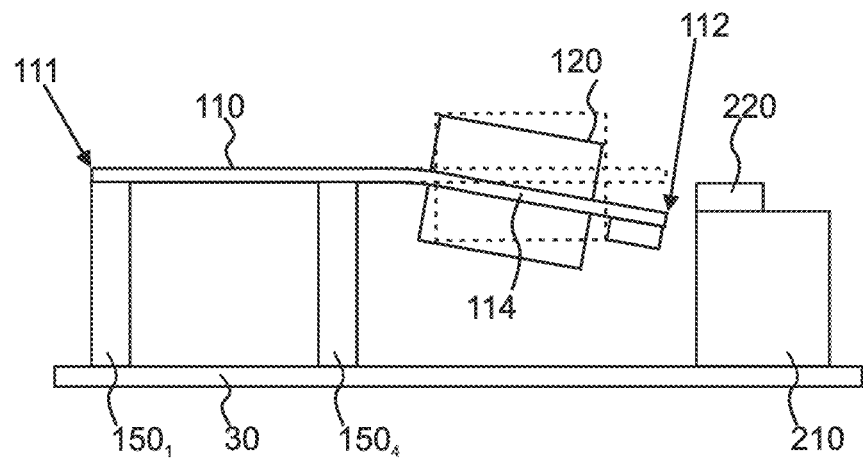

An embodiment of a vibrational energy harvesting device 10 according to the invention is illustrated in FIGS. 1 and 2. The device 10 comprises a first assembly 100 and a second assembly 200 mounted at a distance one from the other on a base 30. The first assembly 100 comprises an elongate member 110 with a first fixedly supported extremity 111 and an unsupported extremity 112 longitudinally opposed to the first, wherein the elongate member 110 is made of FR4 (PCB) material using a laser micromachining process. The elongate member 110 is slotted so as to define a pair of longitudinal beams 113, 114 extending between the opposed extremities 111, 112.

A first magnetised assembly 120 of four rare earth permanent magnets $120_{1-4}$ for instance made of neodymium material (NdFeB) is mounted to the elongate member 110 within the slotted portion of the elongate member 110, thus between the beams 111, 112, and proximate the unsupported extremity 112 of the elongate member.

A coil 130 is wound using 30 μm diameter enameled copper wire until the coil dimensions are 6.5 mm outer diameter, 1.15 mm inner diameter, 1 mm thickness, 2500 turns, 720Ω resistance. The coil 130 is arranged at the midpoint of the slotted portion of the elongate member 110, between the magnets $120_{1-4}$ within the high flux gradient magnet assembly 120.

In this embodiment, each magnet $120_{1-4}$ of the first magnetised assembly 120 has dimensions of 8 mm×4 mm×2 mm (a) and has a polarity along the transverse direction of the elongate member 110, in such a way that a high flux gradient is created within the slotted portion. Furthermore, two high permeability soft magnetic steel blocks 116, 117 are used on both sides of the magnet assembly 120 still between the beams 113, 114 to further intensify the magnetic flux in the slotted portion.

A further magnet $120_5$ with dimensions of 4 mm×2 mm (a)×1 mm with a polarity along the longitudinal direction of the elongate member 110 is attached to the underside of the unsupported extremity 112 and substantially centrally of the two beams 113, 114, substantially at the tip of the elongate member 110.

The entire first assembly 100 is supported on four cylindrical nylon spacers 150. Two spacers $150_1$, $150_2$ fixedly attach the first assembly to the base 300 at its first extremity 111. Each of the remaining two spacers $150_3$, $150_4$ fixedly attaches a respective beam 113, 114 to the base at its midpoint configured with a tab portion 118 extending away from the main body of the elongate member 110.

Accordingly, with reference to FIG. 2, when the mass composed of the first magnetised assembly 120 oscillates vertically, a respective portion of each beam 113, 114 forward of its tab 118 and the spacer $150_3$, $150_4$, away from the fixed extremity 111 and towards the unsupported extremity 112, is subjected to both bending and longitudinal stretching deformation, which introduce a nonlinear restoring force dependent upon the third power of the displacement.

In order to incorporate bistability in the device 10, the second assembly 200 of the device 10 comprises at least one upright member 210 mounted on the base 30 at a distance from the first assembly 100, a top face 211 of which supports a second magnetised assembly 220, in this embodiment a further magnet with dimensions of 4 mm×2mm (a)×1 mm and a polarity opposed to the polarity of the magnet $120_5$ attached to the underside of the unsupported extremity 112 of the first assembly 100. This configuration exerts repulsive force on the tip magnet $120_5$ of the first assembly, and thus induces bistability into the system dynamics.

Figure 4:
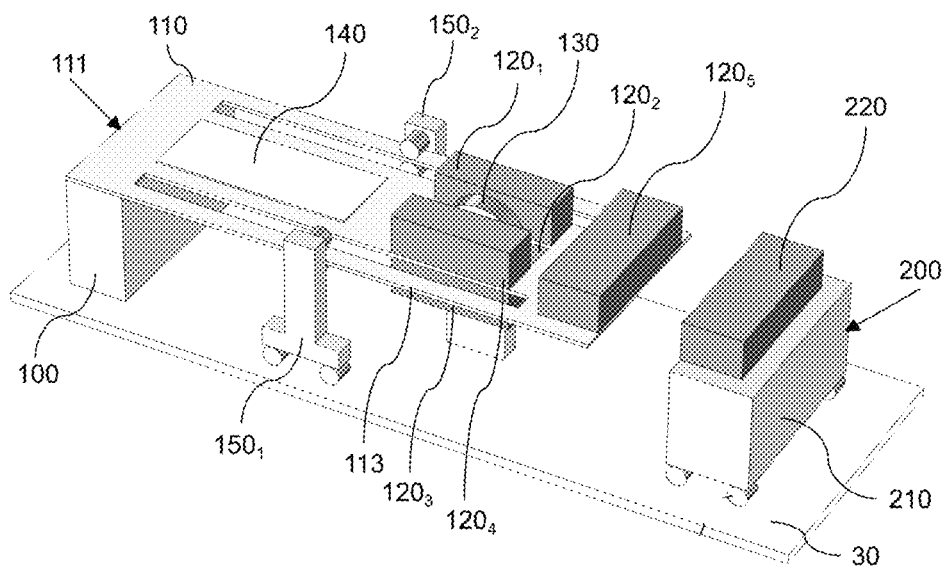
FIG. 4 shows a perspective view of a second embodiment of the bistable-quartic combined configuration where electromagnetic and piezoelectric transduction mechanisms have been implemented.

FIG. 4 shows a second embodiment of the invention, where the clamping points in the middle of the stretchable cantilevers are adjustable by incorporating roller mechanisms in the spacers $150_1$ and $150_2$. At the same time, a piezoelectric material patch 140 can be attached to a bendable section of the cantilever structure, with the capability of transducing beam deflection into electricity.

Figure 5:
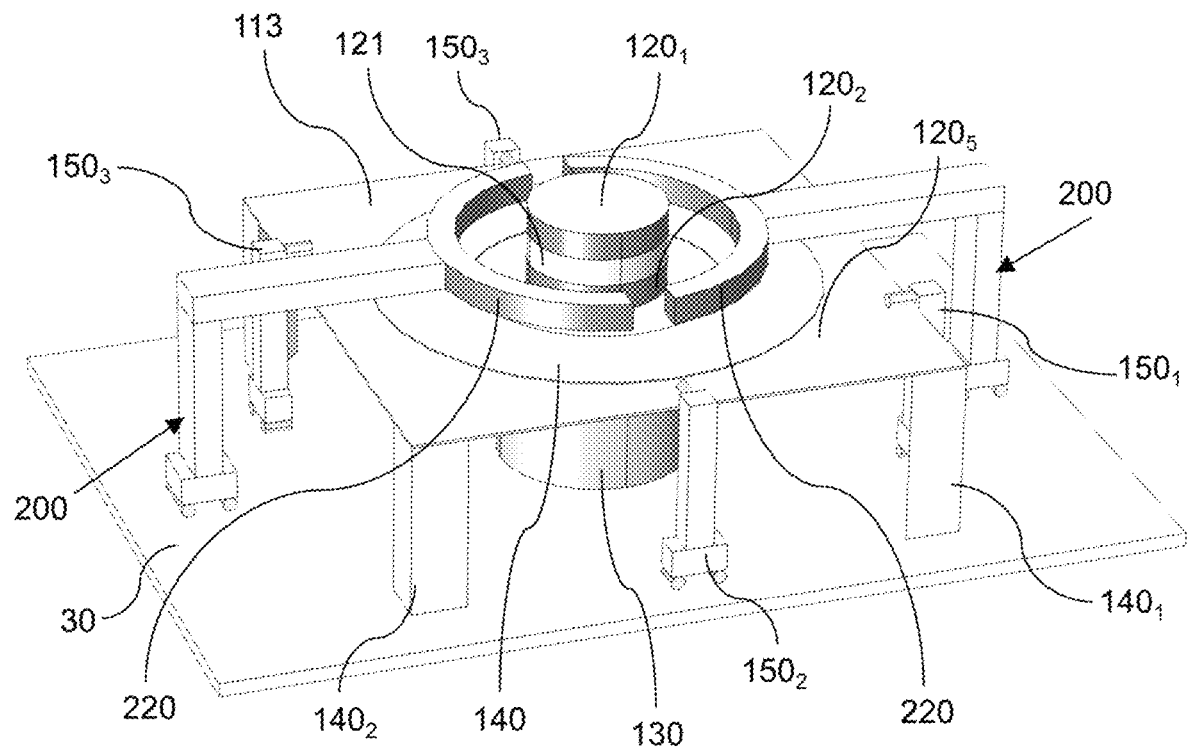
FIG. 5 shows a perspective view of a third embodiment of the bistable-quartic combined configuration where electromagnetic and piezoelectric transduction mechanisms have been implemented.
Figure 6:
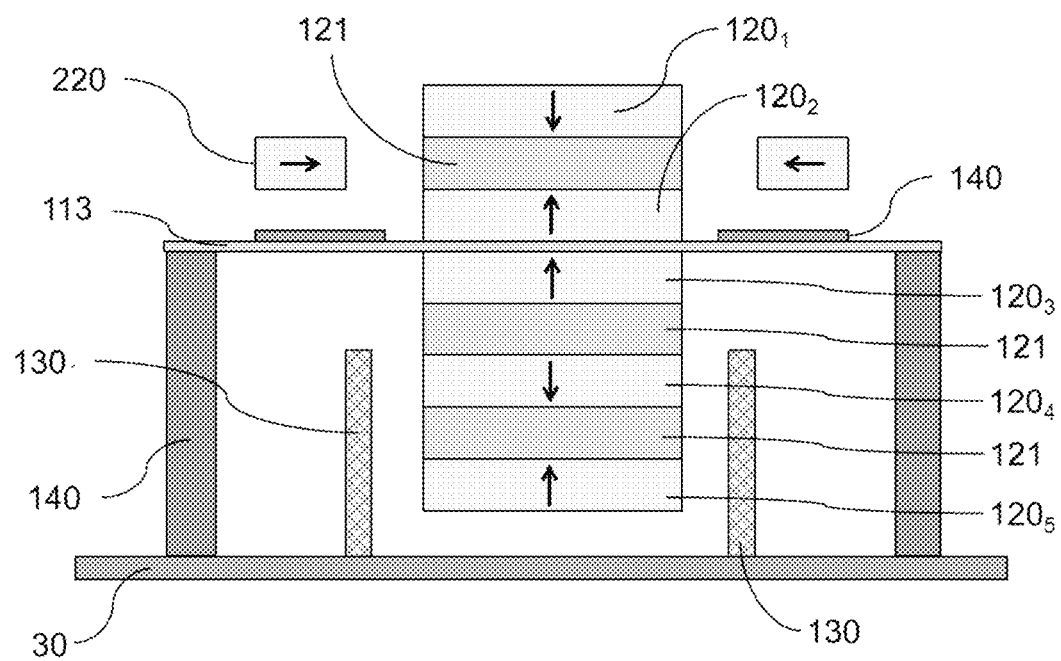
FIG. 6 shows a cross-sectional view of the third embodiment of the bistable-quartic combined configuration where electromagnetic and piezoelectric transduction mechanisms have been implemented.

FIGS. 5 and 6 show a third embodiment of the invention, where a diaphragm structure 113 is fixedly clamped at four corners supported by fixed spacers $140_1$-$140_4$. Four adjustable clamps $150_1$-$150_2$ mounted on roller mechanisms can be slided along the four sides to vary the effective vibrating area of the diaphragm. This embodiment also results into variable stiffness and quartic monostable potential due to the variable effective vibrating area. Cylindrical magnets $120_1$-$120_5$ and coil arrangements 130 can be made near the centre of the diaphragm to implement electromagnetic transduction. An annular piezoelectric sheet 140 can be attached around the magnet arrangement to transduce diaphragm deflection into electricity.

The modification in the potential energy profile of the bistable-monostable combined system 100, 200 and the resulting dynamics has been illustrated mathematically. The nonlinear monostable contribution appears in the developed system due to stretching strain in addition to the bending strain of the doubly-clamped beams 113, 114 whereas the nonlinear bistable contribution comes into play through the interaction of the oppositely polarized magnets $120_5$, 220. The total mechanical potential energy of the device can be expressed as:

$$U(x) = \frac{1}{2}kx^2 + \frac{1}{4}k_n x^4 + U_m(x)$$

where k and $k_n$ are the linear and nonlinear spring stiffness respectively and $U_m(x)$ represents the potential energy contribution due to magnetic repulsive force on the oscillator and x is the vertical displacement of the equivalent mass, i.e. the transducing magnet assembly 120.

Figure 3:
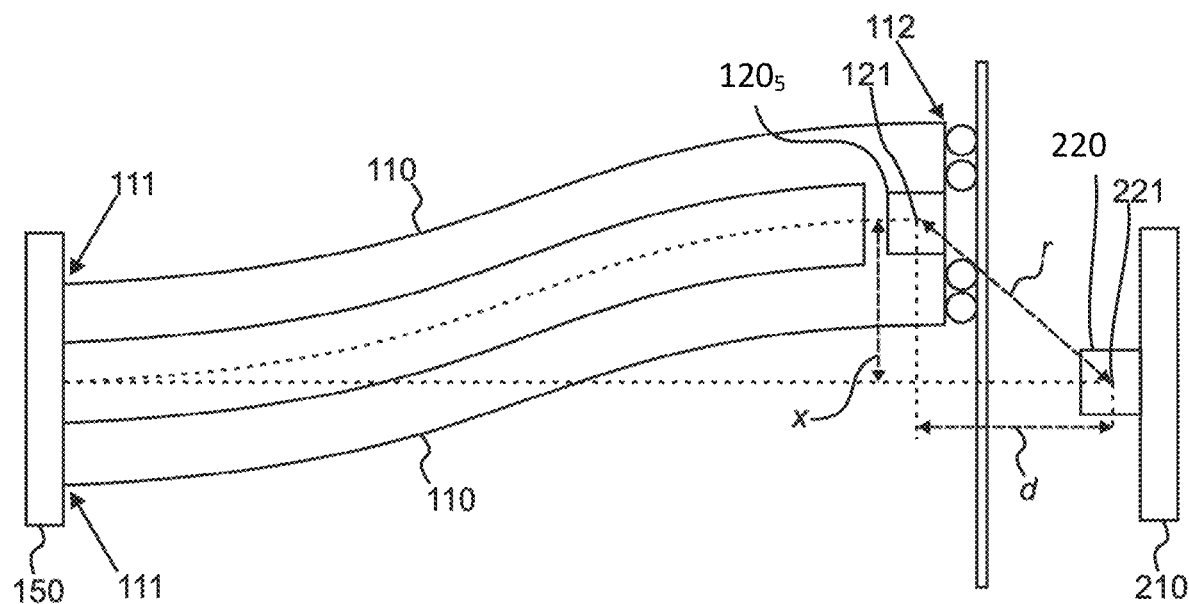
FIG. 3 shows a schematic model of the bistable-monostable combined configuration of FIGS. 1 and 2.

With reference to FIG. 3, the magnetic interaction potential can be expressed as:

$$U_m(x) = -\frac{\mu_0}{4\pi r^3}\left[3\left(m_1\frac{d}{r}\right)\left(-m_2\frac{d}{r}\right)+m_1 m_2\right] = \frac{\mu_0 m_1 m_2}{4\pi}\frac{(2d^2 - x^2)}{(x^2+d^2)^{5/2}}$$

where $\mu_0$ is the permeability of air, m1 and m2 are the magnetic dipole moments of the repulsively oriented magnet pair $120_5$, 220, d is the distance between the centres 121, 221 of the magnets $120_5$, 220 when they are anti-parallel and in front of each other.

With reference to FIG. 3 still, the vertical displacement of the oscillator 110 is denoted by x and r denotes the distance between the centres 121, 221 of the oppositely polarized tip magnet $120_5$ and the external magnet 220 at the deflected position. The total restoring force experienced by the oscillator is given by:

$$F_R(x) = -\frac{\partial}{\partial x}U(x) = -kx - k_n x^3 - \frac{\mu_0 m_1 m_2}{4\pi}\frac{3x(x^2 - 4d^2)}{(d^2+x^2)^{7/2}}$$

The extent of the repulsive magnetic force on the tip 112 of the cantilever 110 can be controlled by altering d, the distance between the tip magnet $120_5$ and the externally positioned magnet 220. Therefore, the magnetic interaction potential and its contribution to the total restoring force can also be modified by adjusting d.

Figure 7:
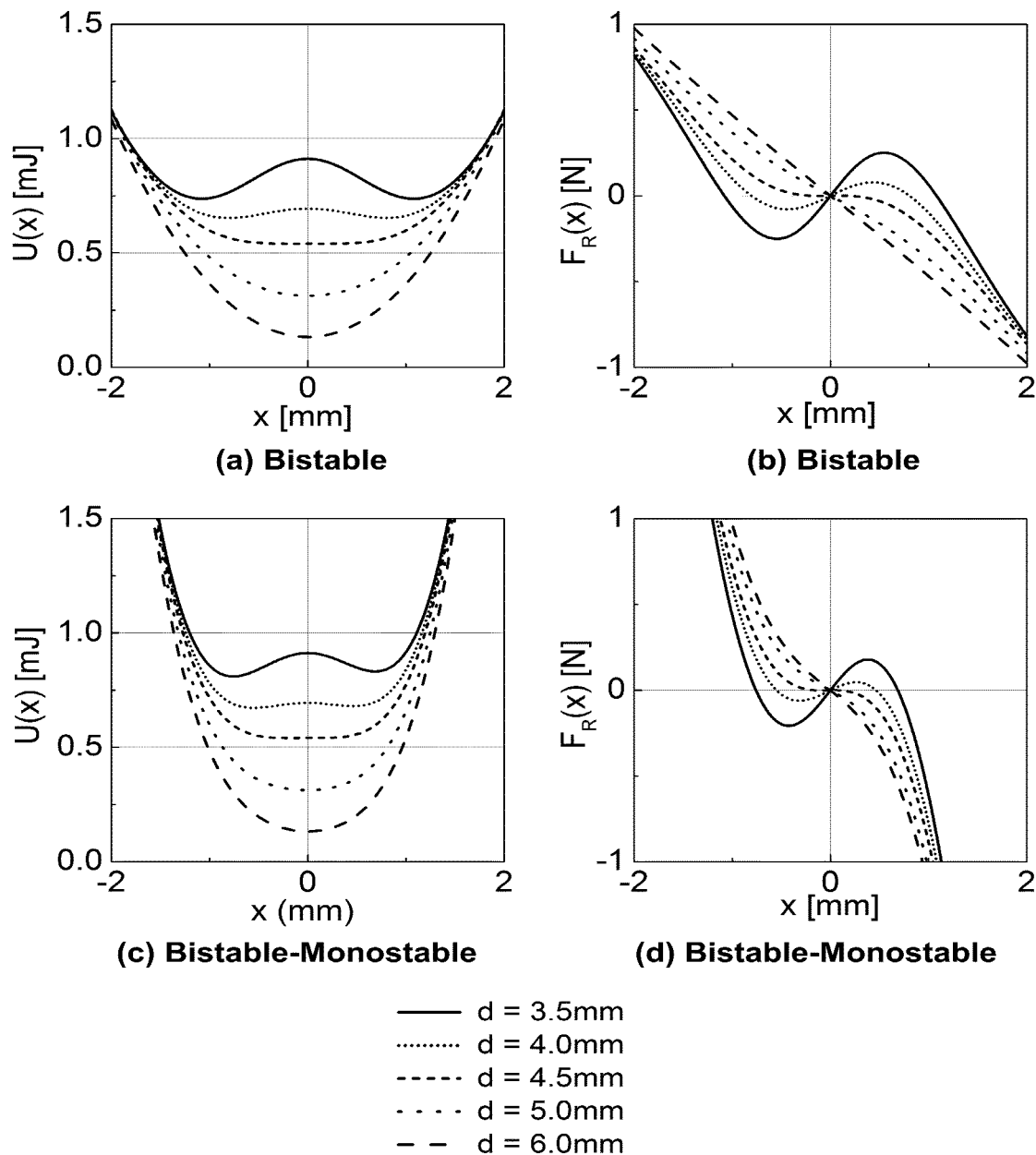
FIG. 7 is a series of graphs plotting the variation of potential energy function [U(x)] and restoring force [$F_R(x)$] for different values of the distance d between opposed magnets in several modes including (a) bistable U(x), (b) bistable $F_R(x)$, (c) bistable-monostable U(x) and (d) bistable-monostable $F_R(X)$.

The effect of nonlinear force contribution due to bistability and stretching induced monostable quartic nonlinearity on the potential energy (U(x)) and restoring force ($F_R(x)$) based on the above equations are illustrated in FIG. 7 for different distances (d) between the repulsive magnets $120_5$, 220.

For a larger gap (d=6 mm), the repulsive interaction between the magnets $120_5$, 220 is negligible and the spring characteristics of the bistable configuration resemble that of a linear one, while the bistable-monostable combined potential energy and restoring force profile exhibit cubic nonlinearity. Moreover, the potential energy profile for the bistable-monostable combined case is substantially narrower than the bistable configuration, indicating hardening nonlinearity, i.e. higher restoring force at the same deflection compared to the bistable case.

As d is decreased, the potential energy profile and restoring force transform into nonlinear bistable in both configurations. While the restoring force for the bistable case follows an almost linear path at large deflections (far away from the x=0 position), the restoring force for the bistable-monostable combined configuration at similarly large deflections follow a cubic nonlinear force path. This indicates that, for high amplitude oscillation, the dynamics of the device 10 will be governed mainly by the monostable quartic nonlinearity. On the other hand, in the case of small to moderate amplitude oscillation, the magnetically-induced bistability would have significant effect on the device dynamics.

However, the most favorable effect of inducing monostable hardening nonlinearity into a bistable system is the modest decrease in the relative height of the potential barrier (FIG. 7(c)) with respect to the potential wells. The resulting reduced barrier can be crossed by the oscillator at lower amplitude vibrations, triggering large amplitude inter-well motion that produces higher energy. The dynamical system equation can be expressed as:

$$M\ddot{x} + kx + k_n x^3 + \frac{\mu_0 m_1 m_2}{4\pi}\frac{3x(x^2 - 4d^2)}{(d^2+x^2)^{7/2}} + D\dot{x} + \gamma I = -M\ddot{y}$$

where M is the equivalent mass of the system 10, D is the mechanical damping factor, $\gamma$ is the electromagnetic coupling factor, I is the current induced in the coil and $y = Y_0 \sin \omega t$ is the displacement due to external vibration.

If the total resistive load in the electrical circuit is denoted by R, the electrical circuit can be represented as:

$$L\dot{I} + RI = \gamma \dot{x}$$

where L denotes the inductance of the coil.

In use, the device is excited at different vibrational accelerations (0.02 g-1.6 g) within a frequency range of 10 Hz to 90 Hz in both forward and reverse frequency sweep at a sweep rate of 0.333 Hz per second. Three different nonlinear configurations, i.e. bistable, monostable, and a combination of bistable and monostable are investigated. In each case, the output voltage of the device 10 is measured across an optimum resistive load of 3 kΩ, which was experimentally determined for a linear configuration of the device.

Figure 8:
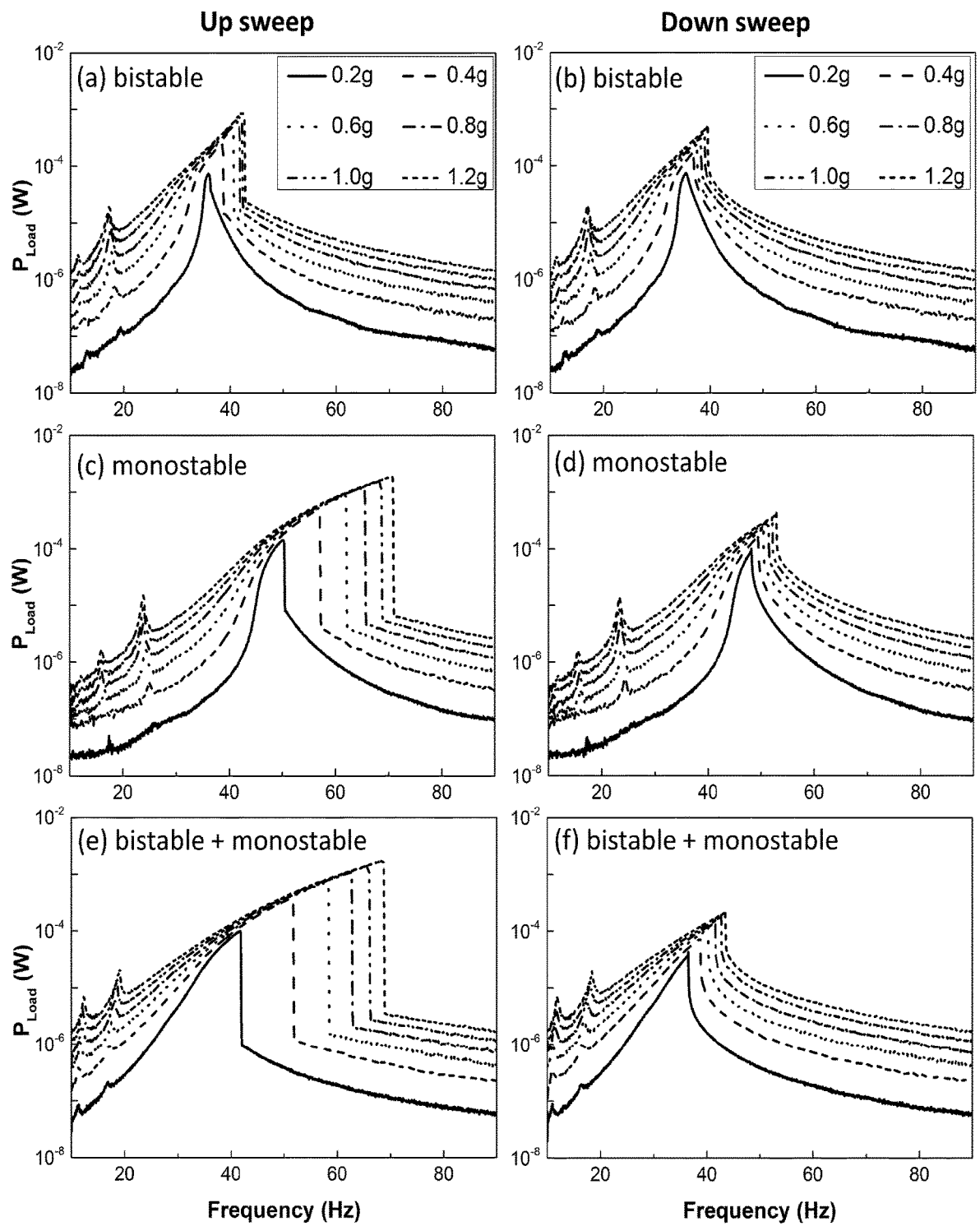
FIG. 8(a)-8(f) are a series of graphs plotting the forward sweep and reverse sweep responses [10 Hz-90 Hz] of load power against frequency for (a,b) bistable, (c,d) monostable, and (e,f) bistable-monostable combined configurations.

The frequency response plots at different accelerations (0.2 g-1.2 g) for the bistable, stretching based monostable and bistable-monostable combined configurations are shown in FIG. 8.

In order to avoid the stretching effect in the bistable-only configuration, the pair of clamped-guided beams 113, 114 in the device structure was discarded in the bistable case and the spring was stiffened, so that the linearized resonance frequency would remain nearly the same for all the configurations. While the gap between the repulsively positioned magnets $120_5$, 220 is fixed at d=4 mm for the bistable-only and the bistable-monostable combined configuration, it is set at d=10 mm for the monostable-only configuration.

In all the cases, the frequency responses show hardening nonlinearity and the forward and reverse sweep responses exhibit hysteretic behavior. All three configurations demonstrate increasing load power and forward sweep jump frequencies with increasing vibrational acceleration. The forward sweep jump frequencies ($f_{Peak}$) at 1 g acceleration for the bistable, monostable and bistable-monostable combined configurations are 42 Hz, 68.44 Hz and 65.9 Hz respectively. The peak load power ($P_{Peak}$) at 1 g acceleration for these three device configurations are 0.727 mW, 1.573 mW and 1.403 mW respectively.

In all three nonlinear configurations, super-harmonic peaks are also observed near $\frac{1}{3}^{rd}$ and $\frac{1}{2}$ of the linearized resonance frequencies. With increasing acceleration, the half-power bandwidth (BW) of each configuration was also observed to increase. With reference to FIG. 8, it is apparent that the half-power bandwidth observed for the bistable-monostable combined case is wider than either of the individual bistable or monostable configurations.

It can also be observed from FIG. 8 that in the bistable-monostable combined configuration, the most significant contribution of bistability is in broadening the monostable frequency response towards the lower frequency domain. At a constant applied acceleration level, the vibration amplitude is comparatively higher in the low frequency regime, enabling the oscillator to easily cross the reduced potential barrier of the combined structure (FIG. 7(c)) and perform the large amplitude motion. At 1 g acceleration, the BW for the bistable, monostable and bistable-monostable combined configurations are 3.24 Hz, 8.7 Hz and 9.28 Hz respectively.

Figure 9:
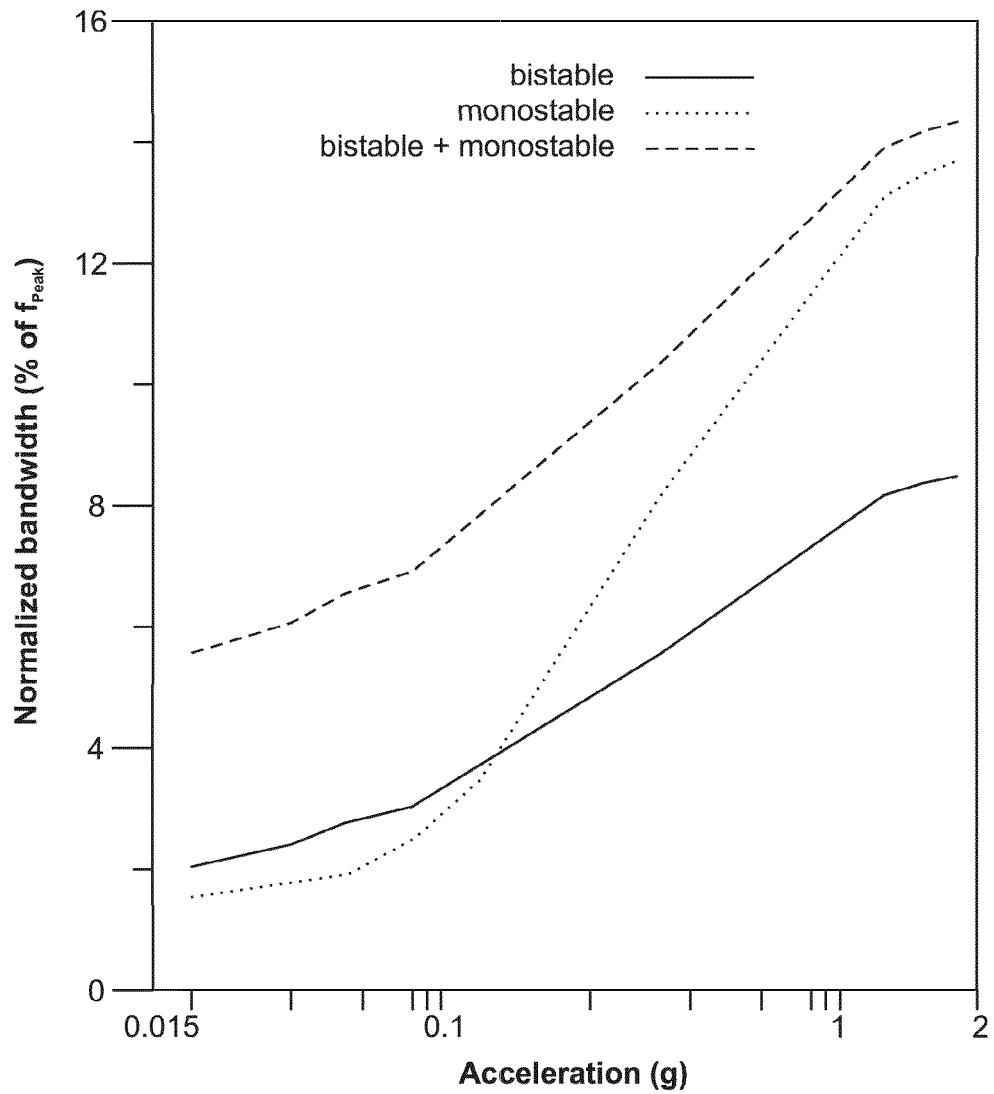
FIG. 9 is a graph plotting normalized bandwidth against acceleration for bistable, monostable and bistable-monostable combined configurations of the device shown in FIGS. 1 to 3, wherein normalized bandwidth is expressed as percentage of peak power frequency ($f_{Peak}$).

The dependence of normalized bandwidth, expressed as the percentage of the peak load power frequency or saddle node frequency for each sweep, on the vibrational acceleration, is depicted in FIG. 9.

At 0.2 g, the normalized bandwidth BW for the bistable, monostable and bistable-monostable combined configurations are 4.24%, 5.56% and 9.75% of $f_{Peak}$ respectively. As the applied vibrational acceleration is increased in steps, the normalized bandwidth also increases for the three configurations. At the highest acceleration level (1.6 g) the normalized bandwidths become 8.66%, 13.83% and 14.99% of $f_{Peak}$ for the bistable, monostable and bistable-monostable combined configurations respectively.

Thus, with increasing acceleration, the bandwidth widening effect of bistable-monostable combined configuration become less significant in comparison to the individual bistable and monostable cases. This is because of the fact that with increasing acceleration the amplitude of oscillation increases, resulting in higher nonlinear stretching strain in both monostable and the bistable-monostable combined configuration (FIG. 7(d)).

Therefore, with higher acceleration the cubic nonlinear restoring force in the system is enhanced, which contributes to the broader frequency bandwidth. On decreasing the vibrational acceleration below 0.2 g, the contribution of the monostable quartic nonlinearity (3.458% of $f_{Peak}$ at 0.1 g) in the bandwidth is reduced in comparison to the contribution from bistability (4.082% of $f_{Peak}$ at 0.1 g). The diminished contribution of the stretching-based monostable quartic nonlinearity in the bandwidth is due to reduced vibrational amplitude at lower accelerations.

On the other hand, the bistable nonlinearity is most effective in the low amplitude oscillation scenario (FIGS. 7(c), 7(d)) and contributes significantly towards the bandwidth of the bistable-monostable combined configuration below 0.1 g acceleration. Effectively, bistable-monostable combined configuration achieves much wider bandwidth (8.093% of $f_{Peak}$ at 0.1 g) in comparison to the individual bistable (4.082% of $f_{Peak}$ at 0.1 g) or monostable (3.458% of $f_{Peak}$ at 0.1 g) configurations.

The performances of all the different configurations of the proposed device 10 in random vibration environment are investigated in an applied band-limited (10-500 Hz) random vibration with low ($8 \times 10^{-3}$ g²/Hz, 0.2 g RMS), medium ($2 \times 10^{-3}$ g²/Hz, 1 g RMS), and high ($8 \times 10^{-3}$ g²/Hz, 2 g RMS) accelerations. The resulting PSDs of the linear device produce sharp peak at 43.1 Hz for all accelerations. As bistability is incorporated by reducing the gap (d=4 mm) between the repulsively positioned magnets, the peak shifts towards lower frequencies and is broadened. The potential barrier between the two bistable potential wells is small (FIG. 7(a)) in this configuration and can be passed over by the oscillator at all accelerations. However, on decreasing the gap further (d=3.5 mm) the potential barrier in the bistable configuration become higher (FIG. 7(a)), resulting in confinement of the oscillator in a single potential well and increased stiffness. Consequently, the PSDs in this configuration exhibit sharp peaks similar to the linear configuration, near 50 Hz at low and medium accelerations.

At high acceleration this configuration may perform chaotic jumps between the potential wells, giving rise to broader response with a peak near 50 Hz. The monostable nonlinear variant of the device produces steep peaks, resembling the linear device, near 46 Hz at all acceleration levels. As bistability is introduced into the monostable configuration (d=4 mm), the peak is broadened and shifted to the lower frequency domain for all accelerations. On decreasing the gap further (d=3.5 mm), the response of the bistable-monostable combined configuration produces even wider response, unlike the bistable-only variant, at all accelerations. This can be attributed to the higher restoring force and lowering of the bistable potential barrier height (FIG. 7(c), 7(d)) due to the incorporation of monostable quartic nonlinearity, which enables the oscillator to perform inter-well jump at all vibrational accelerations. In general, the bistable-monostable combined configuration exhibits broader bandwidth under all vibrational accelerations, in comparison to the individual bistable or monostable variants.

In conclusion, a novel device architecture has been developed, which exploits both bistable and monostable quartic nonlinearity simultaneously in a vibrational energy harvesting device for wider bandwidth. The modified potential energy profile due to the combined nonlinearity results into higher restoring force during oscillation and activates large amplitude inter-well motion at relatively lower accelerations due to the reduced potential barrier.

An embodiment 10 has been described wherein monostable quartic nonlinearity is incorporated by a pair of clamped guided beams 113, 114 and bistability is introduced through the repulsive interaction between magnets $120_5$, 220.

Experimentally, it has been observed that the bandwidth of the bistable-monostable combined configuration is broadened towards the lower frequency regime in comparison to the individual bistable or monostable systems, and produces bandwidth of 9.95% of peak power frequency at 0.2 g acceleration, whereas the same values for the individual bistable and monostable systems are 4.54% and 5.66% respectively. This effect is due to potential well modification and the broadening effect is more pronounced at the lower accelerations under harmonic excitations.

At 1 g acceleration the bistable-monostable combined configuration produced a peak load power of 1.403 mW at a peak power frequency of 65.9 Hz and achieved a half-power bandwidth of 9.282 Hz (14.08% of peak power frequency). Additionally, under band-limited random vibration the bistable-monostable combined configuration attained a wider power spectral density in comparison to the individual systems, as it is enabled to perform cross-well jump due to the higher restoring force and reduced potential barrier. The proposed bistable-monostable combined device topology could be further modified and implemented in other transduction (piezoelectric, electrostatic, triboelectric) mechanisms for different wideband practical application scenario.

The embodiment may be further miniaturized to the MEMS (Micro-Electro-Mechanical Systems) scale where the stretchable spring or diaphragm is fabricated on silicon or silicon-on-insulator (SOI) wafer using standard microfabrication techniques or on other metal or polymer material. The copper coil may also be microfabricated and integrated on the spring platform. Rare earth or non-rare earth permanent magnets may be fabricated using sputtering, electrodeposition or other physical or chemical deposition techniques to facilitate complete integration of the device.

In the specification the terms "comprise, comprises, comprised and comprising" or any variation thereof and the terms include, includes, included and including" or any variation thereof are considered to be totally interchangeable and they should all be afforded the widest possible interpretation and vice versa.

The invention is not limited to the embodiments hereinbefore described but may be varied in both construction and detail.

The invention claimed is:

1. A broadband vibrational energy harvesting device adapted to simultaneously combine bistable and monostable quartic potential energy profiles, the device comprising
   first and second assemblies mounted at a distance one from the other;
   wherein the first assembly comprises vibrational means adapted to stretch under a straining force, whereby the device exhibits quartic monostable nonlinearity; and
   wherein the first and second assemblies comprise respective magnetised means in opposite polarity to one another, so that the second assembly exerts a repulsive magnetic force upon the vibrational means, whereby the device exhibits bistability.

2. A vibrational energy harvesting device according to claim 1, wherein the bistable and monostable quartic potential energy profiles are adapted to be independently modified.

3. A vibrational energy harvesting device according to claim 1, wherein
   the vibrational means comprises an elongate member with at least one fixedly supported extremity and at least one unsupported extremity longitudinally opposed to the first,
   the magnetised means of the first assembly comprises a first magnetised assembly mounted to the elongate member proximate the unsupported extremity of the elongate member, having at least one magnet with polarity along a longitudinal direction of the elongate member; and
   the magnetised means of the second assembly comprises a second magnetised assembly located adjacent the unsupported extremity of the first assembly, at the distance between the first and second assemblies, and in opposite polarity to the first magnetised assembly such that the repulsive magnetic forces between the first assembly and the second assembly causes multiple equilibrium states.

4. A vibrational energy harvesting device according to claim 3, wherein the elongate member comprises at least one clamped guided cantilever or a diaphragm.

5. A vibrational energy harvesting device according to claim 4, wherein the clamping point of the clamped-guided cantilever or diaphragm is adjustable to vary the cubic-force-deflection relationship.

6. A vibrational energy harvesting device according to claim 4, further comprising at least one piezoelectric element attached to the clamped-guided cantilever or diaphragm for transducing deflection into electricity.

7. A vibrational energy harvesting device according to claim 3, wherein the repulsive magnetic force is adjustable as a function of the distance between the first and the second magnetised assemblies.

8. A vibrational energy harvesting device according of claim 3, wherein the first magnetised assembly comprises a plurality of magnets, generating a high flux gradient, the device further comprising a coil arranged between the magnets.

9. A vibrational energy harvesting device according to claim 8, wherein the second assembly of the device comprises at least one support member and wherein the second magnetised assembly comprises at least one magnet secured to the at least one support member.

10. A vibrational energy harvesting device according to claim 8, wherein the device further comprises at least one magnet fixed to the elongate member substantially at the unsupported extremity, substantially intermediate the first and second magnetised assemblies, having a polarity in the longitudinal direction of the elongate member such that magnetic repulsion is established between the first and second magnetised assembly.

11. A vibrational energy harvesting device according to claim 8, wherein the first magnetised assembly further comprises a plurality of high permeability soft magnetic steel blocks or plates arranged adjacent the plurality of magnets so as to intensify the magnetic flux thereof.

12. A vibrational energy harvesting device according to claim 3, wherein a plurality of elongate leg members mounts the first and second assemblies on a base, and wherein at least one leg member fixedly attaches the first assembly to the base at the fixed extremity thereof.

13. A vibrational energy harvesting device according to claim 3, wherein the elongate member is slotted so as to define a pair of longitudinal beams and wherein the first magnetised assembly is mounted within the slot between the beams.

14. A vibrational energy harvesting device according to claim 1, further comprising means for detecting a low power output of the device operably coupled with means for perturbing and/or driving the first assembly into a high amplitude motion according to a detection output.

15. A vibrational energy harvesting device according to claim 14 wherein the driving means comprises the vibrational means coupled with an energy storage module adapted to actuate, or at least momentarily perturb, the first assembly.

16. A vibrational energy harvesting device according to claim 14, wherein the means to detect is a voltage comparator circuit.

17. A method of harvesting energy with a broadband vibrational energy harvesting device adapted to simultaneously combine bistable and monostable quartic potential energy profiles, the method comprising the steps of
   providing a first assembly of the device, comprising first magnetised means having a polarity and vibrational means adapted to stretch under a straining force, whereby the device exhibits quartic monostable non-linearity;
   providing a second assembly of the device, comprising second magnetised means having a polarity opposite to the polarity of the first magnetised means;
   mounting the first and second assembly at a distance one from the other; and
   subjecting the device to a force apt to induce vibration in the first assembly.

18. A method according to claim 17, comprising the further step of adjusting the distance between the first and second assemblies.

19. A method according to claim 17, wherein the first assembly comprises an elongate member, the method comprising the further step of securing a first extremity of the member to a base, thereby leaving an extremity longitudinally opposed to the first extremity unsupported.

20. A method according to claim 17, comprising the further steps of detecting a low power output of the device operably and driving the first assembly into a high amplitude motion according to the detecting.

* * * * *